(12) United States Patent
Richardson et al.

(10) Patent No.: US 7,346,832 B2
(45) Date of Patent: Mar. 18, 2008

(54) LDPC ENCODING METHODS AND APPARATUS

(75) Inventors: Tom Richardson, South Orange, NJ (US); Hui Jin, Annendale, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 388 days.

(21) Appl. No.: 10/895,547

(22) Filed: Jul. 21, 2004

(65) Prior Publication Data
US 2006/0020872 A1  Jan. 26, 2006

(51) Int. Cl.
*H03M 13/00* (2006.01)
(52) U.S. Cl. ...................... 714/779; 714/758
(58) Field of Classification Search ........... 714/779, 714/758
See application file for complete search history.

(56) References Cited

U.S. PATENT DOCUMENTS

| | | |
|---|---|---|
| 3,542,756 A | 11/1970 | Gallager |
| 3,665,396 A | 5/1972 | Forney, Jr. |
| 4,295,218 A | 10/1981 | Tanner |
| 5,157,671 A | 10/1992 | Karplus |
| 5,271,042 A | 12/1993 | Borth et al. |
| 5,293,489 A | 3/1994 | Furui et al. |
| 5,313,609 A | 5/1994 | Baylor et al. |
| 5,396,518 A | 3/1995 | How |
| 5,457,704 A | 10/1995 | Hoeher et al. |
| 5,526,501 A | 6/1996 | Shams |
| 5,615,298 A | 3/1997 | Chen |
| 5,671,221 A | 9/1997 | Yang |
| 5,860,085 A | 1/1999 | Stormon et al. |
| 5,864,703 A | 1/1999 | Van Hook et al. |
| 5,867,538 A | 2/1999 | Liu |
| 5,892,962 A | 4/1999 | Cloutier |
| 5,933,650 A | 8/1999 | Van Hook et al. |
| 5,968,198 A | 10/1999 | Hassan |
| 6,002,881 A | 12/1999 | York et al. |

(Continued)

OTHER PUBLICATIONS

Ramamoorthy et al., Construction of Short Block Length Irregular Low-Density Parity-Check Codes, 2004, IEEE, pp. 410-414.*

(Continued)

*Primary Examiner*—Mujtaba Chaudry
(74) *Attorney, Agent, or Firm*—Straub & Pokotylo; Michael P. Straub; Ronald P. Straub (57) ABSTRACT

A flexible and relatively hardware efficient LDPC encoder is described. The encoder can be implemented with a level of parallelism which is less than the full parallelism of the code structure used to control the encoding process. Each command of a relatively simple microcode used to describe the code structure can be stored and executed multiple times to complete the encoding of a codeword. Different codeword lengths can be supported using the same set of microcode instructions but with the code being implemented a different number of times depending on the lifting factor selected to be used. The LDPC encoder can switch between encoding codewords of different lengths, without the need to change the stored code description information, by simply changing a code lifting factor used to control the encoding processes. When coding codewords shorter than the maximum supported codeword length some block storage locations and/or registers may go unused.

23 Claims, 6 Drawing Sheets

U.S. PATENT DOCUMENTS

| | | | |
|---|---|---|---|
| 6,073,250 | A | 6/2000 | Luby et al. |
| 6,195,777 | B1 | 2/2001 | Luby et al. |
| 6,247,158 | B1 | 6/2001 | Smallcomb |
| 6,266,758 | B1 | 7/2001 | Van Hook et al. |
| 6,298,438 | B1 | 10/2001 | Thayer et al. |
| 6,339,834 | B1 | 1/2002 | Crozier et al. |
| 6,397,240 | B1 | 5/2002 | Fernando et al. |
| 6,438,180 | B1 | 8/2002 | Kavcic et al. |
| 6,473,010 | B1 | 10/2002 | Viyaev et al. |
| 6,484,284 | B2 | 11/2002 | Smallcomb |
| 6,526,538 | B1 | 2/2003 | Hewitt |
| 6,633,856 | B2 | 10/2003 | Richardson et al. |
| 6,718,504 | B1 | 4/2004 | Coombs et al. |
| 6,731,700 | B1 | 5/2004 | Yakhnich et al. |
| 6,754,804 | B1 | 6/2004 | Hudepohl et al. |
| 6,940,431 | B2* | 9/2005 | Hayami ............... 341/102 |
| 2002/0042899 | A1* | 4/2002 | Tzannes et al. ........... 714/786 |
| 2004/0034828 | A1 | 2/2004 | Hocevar |
| 2004/0098659 | A1* | 5/2004 | Bjerke et al. ............ 714/776 |
| 2005/0050435 | A1* | 3/2005 | Kyung et al. ............ 714/800 |
| 2005/0154958 | A1* | 7/2005 | Xia et al. ................ 714/752 |
| 2005/0229088 | A1* | 10/2005 | Tzannes et al. ........... 714/800 |
| 2005/0246617 | A1* | 11/2005 | Kyung et al. ............ 714/801 |
| 2006/0031734 | A1* | 2/2006 | Stolpman ................ 714/752 |

OTHER PUBLICATIONS

Richardson et al. "The capacity of low-density parity-check codes under message-passing Decoding", IEEE Transactions on Information Theory; pp. 599-618, Feb. 2001, (same inventor) whole document.

Paranchych et al. "Performance of a digital symbol synchronizer in cochannel interference and noise", IEEE Transactions on Communications, pp. 1945-1954; Nov. 2000, whole document.

Sorokine, V. et al. "Innovative coding scheme for spread-spectrum communications", The Ninth IEEE International Symposium on Indoor and Mobile Radio Communications, pp. 1491-1495, vol. 3; Sep. 1998, whole document.

NN77112415. "Digital Encoding of Wide Range Dynamic Analog Signals", IBM Tech. Disclosure Bulletin, Nov. 1, 1997, vol. No. 20; ISSUE No. 6; pp. 2415-2417, whole document.

NN9210335. "Hierarchical Coded Modulation of Data with Fast Decaying Probability Distributions", IBM Tech. Disclosure Bulletin, Oct. 1992, vol. 35; ISSUE No. 5; pp. 335-336, whole document.

T. Richardson and R. Urbanke, "An Introduction to the Analysis of Iterative Coding Systems", pp. 1-36.

T. Richardson, A. Shokrollahi, R. Urbanke, "Design of Capacity-Approaching Irregular Low-Density Parity-Check Codes", pp. 1-43 (Mar. 2001).

T. Moors and M. Veeraraghavan, "Preliminary specification and explanation of Zing: An end-to-end protocol for transporting bulk data over optical circuits", pp. 1-55 (May 2001).

R. Blahut, "Theory and Practice of Error Control Codes", Library of Congress Cataloging in Publication Data, pp. 47-49, (May 1984).

W. W. Peterson and E.J. Weldon, Jr., "Error-Correcting Codes", Second Edition, The Massachusetts Institute of Technology, pp. 212-213,261-263, 263, (1986).

T. Richardson and R. Urbanke, "The Capacity of Low-Density Parity-Check Codes under Message-Passing Decoding", pp. 1-44 (Mar. 2001).

Saied Hemati, Amir H. Banihashemi, VLSI circuits: Iterative decoding in analog CMOS, Proceedings of the 13th ACM Great Lakes Symposium on VLSI Apr. 2003, pp. 15-20.

Mohammad M. Mansour, Naresh R. Shanbhag, Session 11: Low-power VLSI decoder architectures for LDPC codes, Proceedings of the 2002 international symposium on Low power electronics and design Aug. 2002, pp. 284-289.

* cited by examiner

PRIOR ART

| FIGURE 5A |
|---|
| FIGURE 5B |

LDPC ENCODING METHODS AND APPARATUS

FIELD OF THE INVENTION

The present invention is directed to methods and apparatus for encoding data for the purposes of facilitating the detection and/or correction of errors, e.g., through the use of parity check codes such as low-density parity-check (LDPC) codes.

BACKGROUND

Error correcting codes are ubiquitous in communications and data storage systems. Error correcting codes compensate for the intrinsic unreliability of information transfer in these systems by introducing redundancy into the data stream. Recently considerable interest has grown in a class of codes known as low-density parity-check (LDPC) codes. LDPC codes are provably good codes. On various channels, LDPC codes have been demonstrated to be really close to the channel capacity—the upper limit for transmission established by Claude Shannon.

LDPC codes are often represented by bipartite graphs, called Tanner graphs, in which one set of nodes, the variable nodes, correspond to bits of the codeword and the other set of nodes, the constraint nodes, sometimes called check nodes, correspond to the set of parity-check constraints which define the code. Edges in the graph connect variable nodes to constraint nodes. A variable node and a constraint node are said to be neighbors if they are connected by an edge in the graph.

A bit sequence associated one-to-one with the variable nodes is a codeword of the code if and only if, for each constraint node, the bits neighboring the constraint (via their association with variable nodes) sum to zero modulo two, i.e., they comprise an even number of ones.

Figure 1:
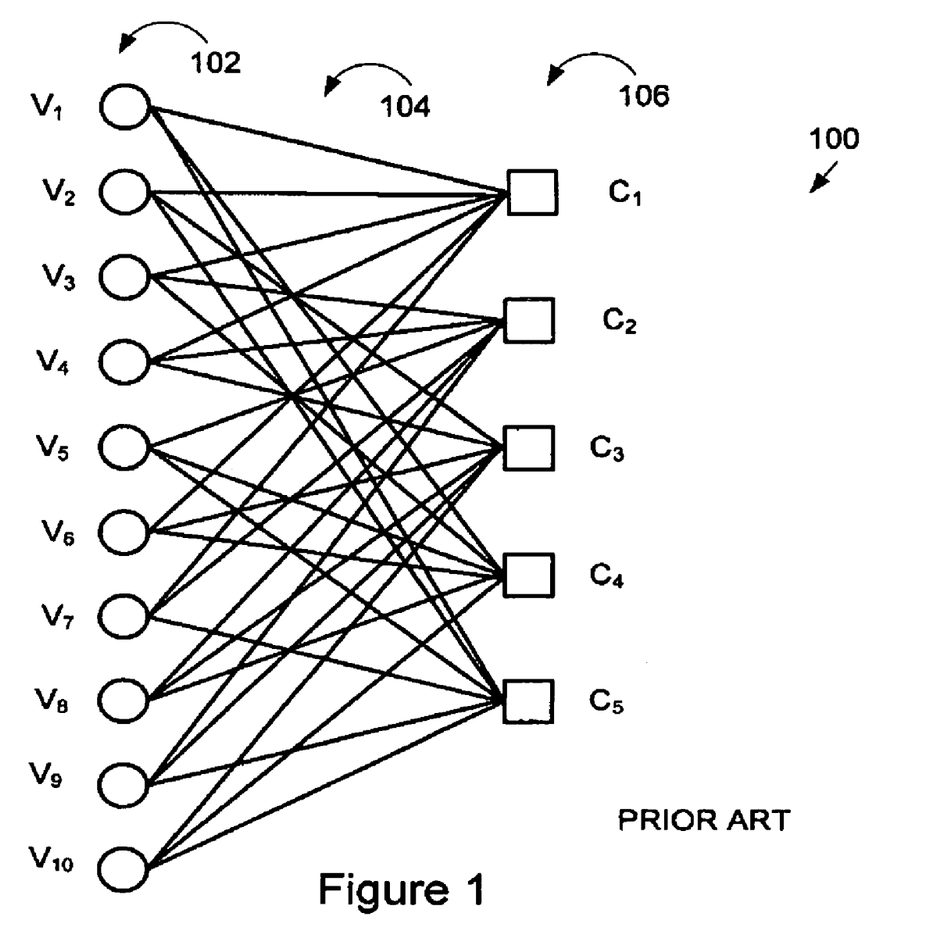
FIG. 1 illustrates a bipartite graph representation of an exemplary regular LDPC code of length ten.

An exemplary bipartite graph 100 determining an exemplary (3,6) regular LDPC code of length ten and rate one-half is shown in FIG. 1. Length ten indicates that there are ten variable nodes $V_1$-$V_{10}$, each identified with one bit of the codeword $X_1$-$X_{10}$. The set of variable nodes $V_1$-$V_{10}$ is identified in FIG. 1 by reference numeral 102. Rate one half indicates that there are half as many check nodes as variable nodes, i.e., there are five check nodes $C_1$-$C_5$ identified by reference numeral 106. Rate one half further indicates that the five constraints are linearly independent. Exemplary bipartite graph 100 includes edges 104, wherein the exemplary (3,6) regular LDPC code has 3 edges connected to each variable node and 6 edges connected to each constraint node and at most one edge between any two nodes.

While FIG. 1 illustrates the graph associated with a code of length 10, it can be appreciated that representing the graph for a codeword of length 1000 would be 100 times more complicated.

Figure 2:
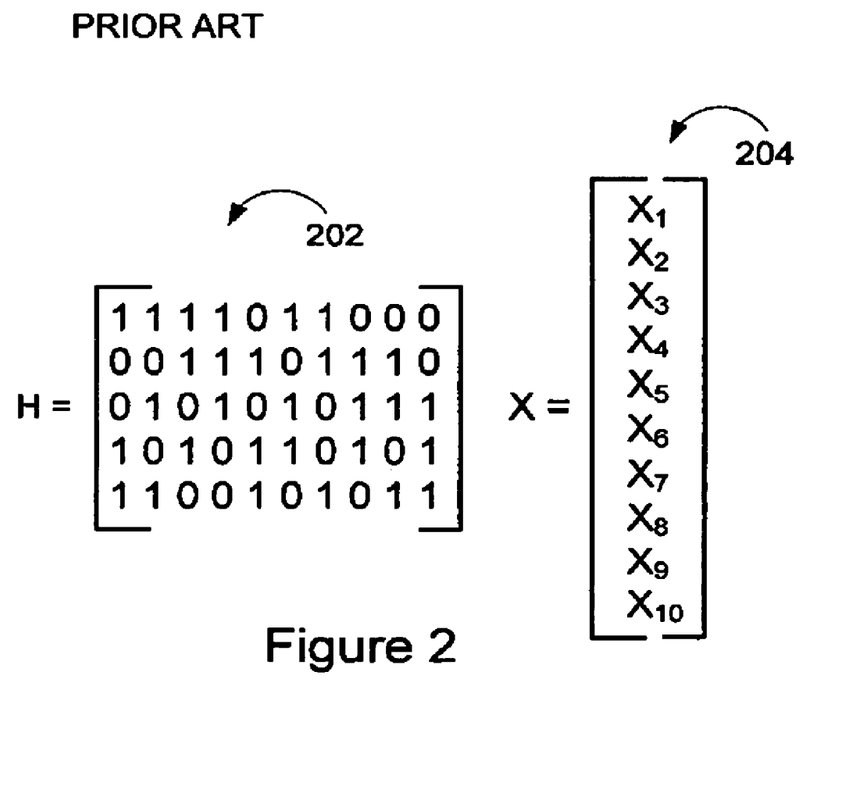
FIG. 2 is a matrix representation of the code graphically illustrated in FIG. 1.

An alternative to the Tanner graph representation of LDPC codes is the parity check matrix representation such as that shown in drawing 200 of FIG. 2. In this representation of a code, the matrix H 202, commonly referred to as the parity check matrix, includes the relevant edge connection, variable node and constraint node information. In the matrix H 202, each column corresponds to one of the variable nodes while each row corresponds to one of the constraint nodes. Since there are 10 variable nodes and 5 constraint nodes in the exemplary code, the matrix H 202 includes 10 columns and 5 rows. The entry of the matrix 202 corresponding to a particular variable node and a particular constraint node is set to 1 if an edge is present in the graph, i.e., if the two nodes are neighbors, otherwise it is set to 0. For example, since variable node $V_1$ is connected to constraint node $C_1$ by an edge, a one is located in the uppermost left-hand corner of the matrix 202. However, variable node $V_5$ is not connected to constraint node $C_1$ so a 0 is positioned in the fifth position of the first row of matrix 202 indicating that the corresponding variable and constraint nodes are not connected. We say that the constraints are linearly independent if the rows of H 202 are linearly independent vectors over GF[2], where GF[2] is the binary Galois Field.

In the case of a matrix representation, the codeword X which is to be transmitted can be represented as a vector 204 which includes the bits $X_1$-$X_n$ of the codeword to be processed. A bit sequence $X_1$-$X_n$ is a codeword if and only if the product of the matrix 202 and matrix 204 is equal to zero, that is: HX=0.

Encoding LDPC codes refers to the procedure that produces a codeword from a set of information bits. By preprocessing the LDPC graph representation or the matrix representation, the set of variable nodes corresponding information bits can be determined prior to actual encoding.

To build an encoder for a general LDPC code, the first step is to find a permutation of the rows and columns of H so that, up to reordering, we can divide the m×n matrix H into the following sub-matrices $$H = \begin{bmatrix} T & A & B \\ E & C & D \end{bmatrix}$$

where T is a t×t upper triangular sub-matrix, i.e. all entries below the main diagonal are zero, E is a g×t submatrix, A is t×g, C is g×g, B is t×(n−m), D is g×(n−m) and t+g=m. Moreover the g×g matrix $\phi := ET^{-1}A + C$ is invertible (we assume here that H is full row rank.)

Encoding then proceeds as follows. To encode codeword $x = [x^{p_1} \; x^{p_2} \; x^s]$ given information bits $x^s$, we first solve

[T A B][y 0 $x^s$]$^T$ = 0 for y using back-substitution. Next we solve $\phi x^{p_2}$ = [E C D][y 0 $x^s$]$^T$ for $x^{p_2}$. For this step the matrix $\phi^{-1}$ is pre-computed. Finally, one solves

[T A B][$x^{p_1}$ $x^{p_2}$ $x^s$]$^T$ = 0 for $x^{p_1}$ using back substitution. The vector [$x^{p_1}$ $x^{p_2}$ $x^s$]$^T$ constitutes the codeword.

While encoding efficiency and high data rates are important, for an encoding system to be practical for use in a wide range of devices, e.g., consumer devices, it is important that an encoder be capable of being implemented at reasonable cost. Accordingly, the ability to efficiently implement encoding schemes used for error correction and/or detection purposes, e.g., in terms of hardware costs, can be an important consideration.

In view of the above discussion it should be appreciated that there is a need for encoder apparatus and methods directed to efficient architecture structures for implementing LDPC codes. Apparatus and methods that allow the reuse of the same hardware to encode codewords of different lengths would be beneficial and desirable. This is because it would allow for greater flexibility during encoder use and allow different sets of data to be encoded using codewords of different sizes thereby allowing the codeword size to be selected for a particular encoding application, e.g., communications session or data storage application, without the need for multiple encoders to support such flexibility.

SUMMARY OF THE INVENTION

The present invention is directed to encoding methods and apparatus, e.g., methods and apparatus for implementing a low density parity check (LDPC) encoder. Various embodiments of the invention are directed to particularly flexible encoders which allow a single encoder to be used to encode codewords of different lengths. This allows an LDPC encoder of the present invention to switch between encoding codewords of a first length for a first application, e.g., a first communications application or data storage application, to encoding codewords of a second length for a second application. In fact, a wide variety of codeword lengths can be supported using the same hardware allowing for changes in codeword length through simple modifications in the codeword description used in the encoder. Codeword descriptions may be reflected in relatively simple microcode which can be executed as needed for a particular application.

The encoder of the present invention can store multiple sets of microcode corresponding to different codes structures. When a code structure is selected to be used for encoding, the corresponding microcode is selected and codewords of a particular length corresponding to the selected code structure are generated. For a given code structure, codewords of different lengths may be generated by selecting different code lifting factors. Use of a code lifting factor less than the maximum supported code lifting factor will normally result in some memory locations, e.g., block storage locations, going unused in the encoder memory. The number of block storage locations provided in memory is normally determined by the maximum supported codeword size.

The encoder of the present invention can switch between different lifting factors thereby allowing the encoder to switch between generating codewords of different lengths. Thus, the encoder of the present invention can be used to generate codewords of a length which is well suited for a particular application and is not constrained by hardware to generating codewords of a single length. However, the maximum supported codeword length in many cases will be a function of the amount of memory available for storing blocks of bits during encoding.

The maximum supported codeword size may be K×N×L bits with the different size codewords including integer multiples of (N×L) bits up to the maximum of K multiples, where K, N and L are positive integers.

The encoder of the present invention is particularly well suited for encoding codewords which can be generated according to LDPC graphs which define a code that possess a certain hierarchical structure in which a full LDPC graph appears to be, in large part, made up of multiple copies, Z, e.g., of a Z times smaller graph. The Z graph copies may, but need not be, be identical. For purposes of explaining the invention, we will refer to the smaller graph as the projected graph, the full graph as the lifted graph, and Z as the lifting factor. Thus, the projected graph serves as the basis of generating or describing the larger lifted graph which described the code structure used to control encoding.

Consider indexing the projected LDPC graphs by 1, . . . , j, . . . , Z, where j is an integer used as a projected graph index and z is the total number of projected graphs used to define the lifted graph. In a strictly parallel graph where the lifted graph is generated by simply copying the projected graph Z times, variable nodes in graph j are connected only to constraint nodes in graph j. That is, there will be no interaction between the edges of the projected graphs used to form the larger lifted graph.

The encoder of the present invention is not so limited. In accordance with the invention, it is possible to take one vector edge, including one corresponding edge each from each of the Z graph copies, and allow a permutation within the Z edges, e.g., we permit the constraint nodes corresponding to the edges within the vector edge to be permuted, e.g., re-ordered.

We may restrict the permutations to be in the space of a set (usually a group) of Z×Z permutation matrices, denoted as $\Psi$. Thus, $\Psi$ will be used herein to refer to a set of permuation matrices which is usually a group of permuation matrixes. We assume that the inverses of the permutations in $\Psi$ are also in $\Psi$. The set $\Psi$ can in general be chosen using various criteria. One of the main motivations for the above structure is to simplify hardware implementation of decoders and encoders. Therefore, it can be beneficial to restrict $\Psi$ to permutations that can be efficiently implemented in hardware, e.g., in a switching network.

In accordance with the present invention, an LDPC encoding procedure can, and in various embodiments is, laid as an ordered sequence of matrix addition and multiplication operations may be translated into a sequence of commands. For convenience of description, we denote this sequence of encoding commands for an exemplary graph G as the encoding microcode of G. The actual encoding is then accomplished by sequentially executing the microcode of G, using an encoder of the present invention, which performs various operations in accordance with the microcode on a physical memory preloaded with information bits, e.g., bits to be encoded. Each command comprises an operator op and a memory location indicator. Depending on the operator op, the encoder control logic either reads out a bit location in the memory determined by the memory location indicator and accumulates it to a register, or, writes the register value to location a and resets the register value to zero. The size of the microcode, i.e., the number of commands of within, is at least equal to the number of edges in graph G; often, they might be roughly the same.

Consider a lifted LDPC graph with lifting factor Z. Given a small, projected, graph which is to be used to form a larger graph, e.g. a projected graph, we can form a Z-times larger LDPC graph by replacing each element of H with a Z×Z matrix. The 0 elements of H are replaced with the zero matrix, denoted 0. The 1 elements of H are each replaced with a matrix from $\Psi$. In this manner we 'lift' an LDPC graph to one Z times larger. The complexity of the representation comprises, roughly, the number of bits required to specify the permutation matrices, $|E_H| \log |\Psi|$ plus the complexity required to represent H, where $|E_H|$ denotes the number ones (1s) in H and $|\Psi|$ denotes the number of distinct permutations in $\Psi$. E.g., if $\Psi$ is the space of cyclic permutations then $|\Psi|=Z$. In practice we might have, e.g., Z=16 for n≈1000 where n is the codeword block length. An example of lifting a small parity check matrix H is shown below where each element in H which is a one is replaced with the projected graph to result in the larger projected matrix H shown on the right.

$$H = \begin{bmatrix} 1 & 0 & 1 & 1 & 1 & 0 & 0 \\ 1 & 1 & 1 & 0 & 0 & 1 & 0 \\ 1 & 1 & 0 & 1 & 0 & 0 & 1 \\ 0 & 1 & 0 & 0 & 1 & 1 & 1 \end{bmatrix}$$

$$H = \begin{bmatrix} \sigma_1 & 0 & \sigma_7 & \sigma_9 & \sigma_{11} & 0 & 0 \\ \sigma_2 & \sigma_4 & \sigma_8 & 0 & 0 & \sigma_{13} & 0 \\ \sigma_3 & \sigma_5 & 0 & \sigma_{10} & 0 & 0 & \sigma_{15} \\ 0 & \sigma_6 & 0 & 0 & \sigma_{12} & \sigma_{14} & \sigma_{16} \end{bmatrix}$$

In the matrix H the $\sigma_i$, i=1, ..., 16 are elements (matrixes) of $\Psi$ shown here indexed from the variable node side.

Let us recall a vector x is a codeword if and only if Hx=0. In the lifted matrix representation, x can be treated as a vector of elements in $GF(2^Z)$, instead of a vector of binary element, where $GF(2^Z)$ is Galois field of $2^Z$ elements. In this light, the encoding process as matrix-vector multiplication and vector addition laid out in the background section may be mimicked: every nonzero element 1 in a matrix in the projected graph is replaced by its corresponding Z×Z permutation matrix; every bit in a vector is replaced by a Z-bit vector.

The encoding procedure of a LDPC graph using G as the projected graph can be largely specified as a lifting of the above encoding process for the projected graph. That is accomplished through replacing bit operations in the original algorithm to bit vector operations in the lifted algorithm. At one or more points in the encoding processing, after being read out of memory, the Z bit vectors are subject to a permutation operation, e.g., a re-ordering operation. The re-ordering operation may be a rotation operation, or rotation for short. These rotation operations generally correspond to the rotations associated to the vector edges that interconnect the Z copies of the projected graph to form the single large graph. Therefore, in the lifted microcode, each command comprises an operator op, a rotation number r, and a memory location indicator.

Lifting the microcode of the projected graph in large part specifies the encoding for the lifted graph. An exception is if a matrix inversion, for calculating the matrix $\phi^{-1}$, exists in the projected graph. In such a case, the inversion is not lifted directly to a matrix inversion in the lifted graph. Instead, the matrix inversion is done in the ring over Z×Z permutation matrices and the corresponding encoding commands results in a new set of commands specifying the matrix inversion. In those commands, the required rotations are apparent after appropriate preprocessing of the LDPC representation.

The size of the microcode used in accordance with the invention to describe the lifted graph is thus roughly equal to the number of edges in the projected graph plus the number of additional commands specifying the inversion, which is often small. Therefore, for identical block length, increasing the lifting factor generally reduces the size of the encoding microcode. For large block length, this may save significantly in microcode description memory, e.g., a relatively small memory may be used to store the information describing the large graph to be used for encoding.

In a practical communication or data storage systems, the throughput of the encoder is usually required to match that of the decoder. For a lifted graph with lifting factor Z, implementing hardware parallelism Z on both the encoder and decoder often results in a higher throughput for the encoder than is necessary to match the decoder throughput since the decoder needs a few more iterations to converge, e.g., complete decoding of a codeword.

Based on this inventor supplied insight, it should be appreciated that it may be desirable, and is possible with the present invention, for an encoder to use a smaller implementation parallelism than the decoder and achieve the same throughput in terms of the number of codewords processed in a given period of time.

For another example, in cases that a large lifting factor Z is used for the above mentioned benefit of saving memory in describing a large graph, using an implementation parallelism Z invokes a high number of parallel units in generating an excessive throughput.

Given the fact that hardware complexity is proportional to the implementation parallelism N but graph description complexity is proportional to the lifting factor Z, it is desirable that the implementation parallelism is such that the resulting throughput is matching the requirement without excessiveness while using a lifted graph described using a large lifting factor Z.

Various features of the present invention are directed to methods and apparatus for implementing a vector LDPC encoder with implementation parallelism N using microcode that describes a lifted graph with lifting factor Z, where N is a divisor of Z. Implementation parallelism N may be chosen to match the required throughput, thus using the minimum hardware complexity.

Moreover, in accordance with the present invention, the vector LDPC encoder with implementation parallelism N is capable of generating, e.g., encoding data to produce codewords corresponding to a class of LDPC codes, with the same rate but different block sizes, from the same microcode describing a lifted graph with lifting factor Z. Specifically, as an example, assume Z can be factored $K_1 \times K_2 \times N$, and the projected graph has n variable nodes, then the novel encoder may generate three different codes of different codeword sizes N×n, $K_2$×N×n and $K_1$×$K_2$×N×n.

Thus, a device using the encoder of the present invention can, and often does, switch between encoding using different graphs described in stored microcode depending on the application so that the codewords generated can be of a block size which is appropriate for the particular application. For example, codewords of a first size may be generated for wireless communications while codewords of a second size may be generated for fiber optic communication purposes.

DETAILED DESCRIPTION OF THE INVENTION

The present invention is directed to methods and apparatus for implementing LDPC encoders. Various embodiments of the invention are directed to LDPC encoders and encoding methods which can be implemented in a hardware efficient manner while being relatively flexible with regard to the code structure that can be used during encoding and the size of generated codewords.

Figure 3:
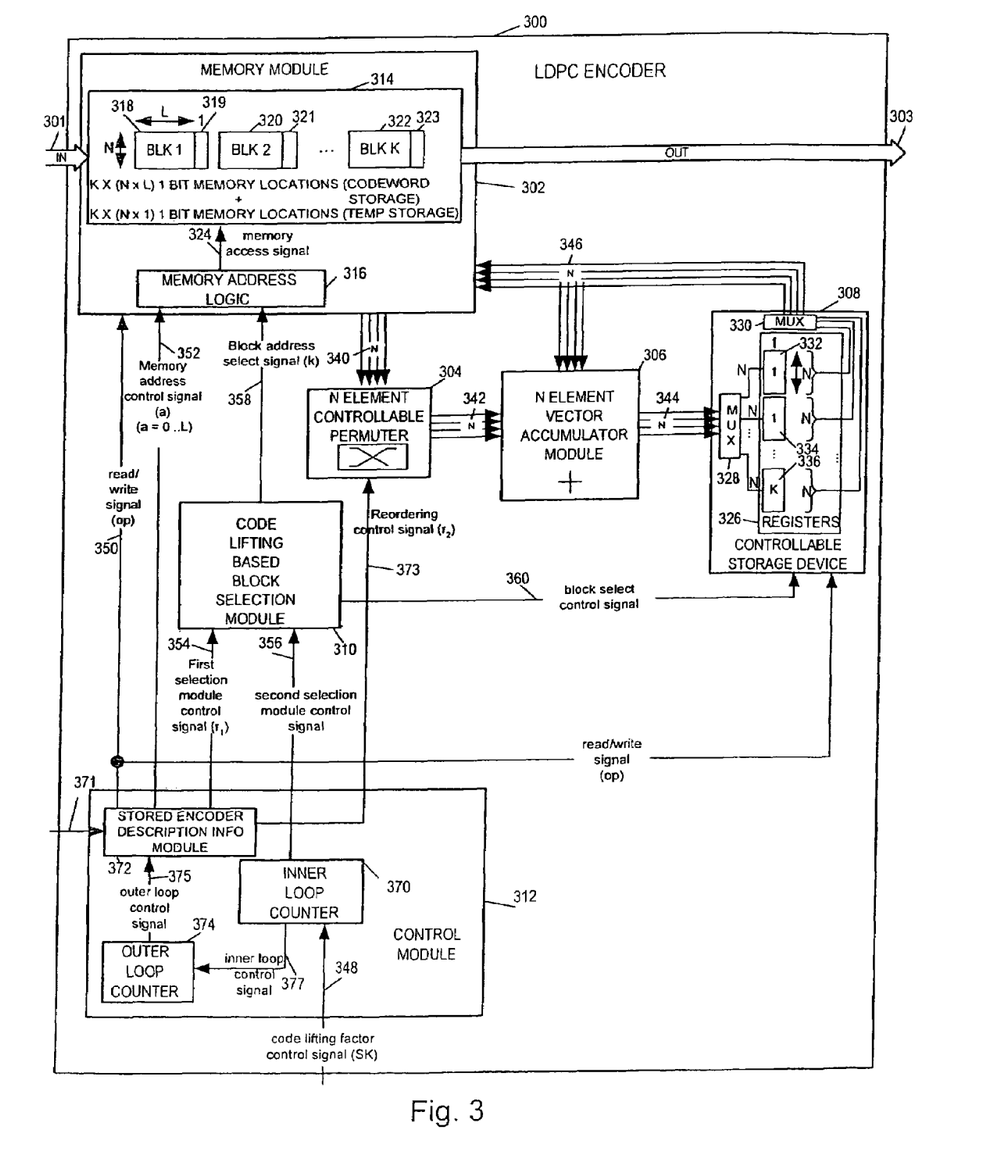
FIG. 3 illustrates an exemplary encoder implemented in accordance with the present invention and also illustrated the flow of various signals and messages within the encoder which are generated in accordance with the encoding methods of the invention.

FIG. 3 illustrates an exemplary LDPC encoder 300 implemented in accordance with the present invention. The encoder includes a memory module 302, a control module 312, a code lifting based block selection module 310, an N element controllable permuter 304, an N element vector accumulator module 306 and a controllable storage device 308 which are coupled together as shown in FIG. 3. Note that the terms permuter and permutator are used interchangeable in the present application to refer to the same thing. The various elements of the LDPC encoder 300 and their function will be described in detail below.

As discussed above, the encoder 300 of the present invention can support different codes with the use of different code descriptions and/or with the use of different codeword lengths, as indicated by different lifting factors, for the same code description. The memory module 302 includes a set of K×N×L memory locations (318, 320, 322) where K×N×L is the maximum supported codeword size. An input 301 allows data to be encoded to be written into said memory. An output 303 allows a codeword stored in the memory 314 to be read out once encoding has been completed. The memory module 302 also includes a set of K×N×1 memory locations (319, 321, 323) used to store temporary values. Other embodiments may not require and may not use temporary storage values. Codewords of smaller sizes can also be supported using the memory 314. The memory locations in memory 314 are arranged, into K N×L blocks used to store codeword values, Blk 1 318, Blk 2 230, Blk K 322 and K N×1 blocks used to store temporary values Blk 1 319, Blk 2 321, Blk K 323. Each of the K×N×L memory locations is normally 1 bit. Each of the K×N×1 memory locations is also normally 1 bit. Reading from and writing to memory locations in the memory 314 is controlled by memory address logic 316 which generates a memory access signal 324 (address and read/write signal) in response to various inputs generated by other components of memory. N bits are normally read from or written to memory module 314 at a time. An N bit wide bus 340 couples an N bit wide read output of memory module 302 to an N bit wide input of the N element controllable permuter 304 which can reorder the bits prior to them being supplied to the N element vector accumulator 306 over an N bit wide bus 342. The N element controllable permuter 304 receives a reordering control signal r2 373 which is generated as a function of stored code description information, e.g., control code such as microcode. The signal r2 373 controls what, if any, reordering of bits is to be performed on the N bits obtained from memory prior to the bits being supplied to the N element vector accumulator module 306.

The N element vector accumulator module 306 includes N accumulator circuits arranged in parallel. Each of the N accumulator circuits generates a one bit binary sum corresponding to one of the N input bits from the N element controllable permuter 304 and a corresponding one of N bits read out of the controllable storage device 308. This is an efficient way of implementing an XOR operation. Thus each accumulator circuit performs an XOR operation. In this manner, the N element vector accumulator 306 generates N accumulated values in parallel. The N values generated by the accumulator module 306 are supplied in parallel over the N bit wide bus 344 to the controllable storage device 308. The controllable storage device 308 includes an input MUX 328, an output MUX 308, and a set of K N-bit registers 326. The input MUX 328 is controlled by a block select control signal 360 to determine which one of K N bit registers 332, 334, 336 an N bit block is written to when the read/write signal 350 indicates the output of the vector accumulator module is to be stored in the controllable storage device 308. Output MUX 330 is coupled to the N bit wide bus 346 and outputs the N bit block indicated by the block select control signal 360 when the read/write control signal 350 indicates a read operation is to be performed. Each set of N bits read out from controllable storage device 308 are supplied to both the memory module 302 and to the second input of the N element vector accumulator module 306. The N bits are written to memory at the end of a sequence of accumulator operations, e.g., as determined by the stored code description.

The control module 312 is responsible for generating a variety of control signals as a function of the particular code description, e.g., control code such as microcode, stored in encoder description information module 372, selected to be used at a particular point in time. In programmable embodiments, the code description information can be loaded into the stored encoder description information module 372, e.g., from a devices main memory via input 371. In embodiments where a single code description is preloaded and used, e.g., for codewords of different length corresponding to the same code structure, input 371 may be omitted. The generation of the signals produced by the encoder description information module 372 are driven by a control signal 375 generated by an outer loop counter 374. The outer loop counter 374 is driven by an inner loop control signal 377 generated by an inner loop counter 370. The inner loop counter 370 generates a second selection module control signal 356 and the inner loop control signal 377 as a function of a code lifting factor control signal SK 348 which is supplied to the inner loop counter 370 as a control value. The code lifting factor control signal can be used to specify the length of the codeword to be generated and may assume values from 1 to K where K indicates the total number of N×L bit blocks in memory 314. Thus, by using different code lifting factors, codewords of different sizes may be generated where each of the different supported codeword sizes will be an integer multiple of N×L. In cases where SK<K, one or more blocks in memory 314 and one or more registers in the set of registers 326 will normally go unused.

The stored encoder description information module 372 includes control code, e.g., microcode. This code, when executed in response to the outer loop control signal 375, generates a read/write signal 350 specified by an op value included in the executed line of microcode. The signal 350 is supplied to both the memory module 302 and the controllable storage device 308. The stored encoder description information module 372 also generates a memory address control signal 352 which is supplied to the memory module 302 when a read/write operation is to be performed, a first selection module control signal r1 354 which is supplied to the code lifting based block selection module 310 and the reordering control signal r2 373 which is supplied to the controllable permuter 304 to control the reordering of values read from memory module 302.

Code lifting based block selection module 310 receives the first selection module control signal r1 354 from the stored encoder description information module 372 and a second selection module control signal 356 generated by inner loop counter 370. The code lifting based block selection module 310 generates a block address select signal 358 which is supplied to memory address logic 316 to indicate a particular block of memory 314 to be accessed at a particular point in time. The code lifting based block selection module 310 also generated the block select control signal 360 which is used to control which block of information, e.g., which register 332, 334, 336 bits are to be accessed in the controllable storage device 308 at a particular point in time.

The various components of encoder 300 are driven by a common clock signal so that the various operations and the incrementing of the counters 370, 374 operate in a synchronized manner.

After a number of processing interactions, the set of information bits initially stored in memory module 314 will be transformed as a result of the encoder processing operations and memory access operations performed under direction of the stored encoder description information module 372 into a codeword. This codeword may be read out and, e.g., transmitted or stored.

In order to obtain a high level of error resiliency, relatively long codewords are often used. For example, a single codeword generated by performing an encoding operation may include a total number of bits T, where T may be several hundred or even thousands of bits. For purposes of explaining the invention it is to be understood that bits to be encoded may be arranged into K×L×N bit vectors, where N is a positive integer and K is a positive integer greater than 1. Each N bit vector may be read from memory. The vector read from memory can then be processed using N processing units in parallel. In contrast to existing systems, which use implementation parallelism N equal to Z in an encoder that encodes codewords using a particular lifted LDPC code with a lifting factor Z, the present invention allows for the level of parallelism in the encoder to be different from the total supported lifting factor Z., More specifically, Z=K×N, where K is an integer greater than 1. Thus, in accordance with the present invention, in various implementations, the level of parallelism N is lower than the lifting factor Z. Furthermore, in some embodiments, codewords of different sizes can be generated using the same set of code description information. By selecting a code lifting factor control value SK which is less than K, the maximum supported lifting factor control value, codewords less than the maximum codeword size for a given implementation (L×K×N) can be created. The different size codewords will be multiples of N×L bits.

U.S. patent application Ser. No. 10/788,115 titled "METHOD AND APPARATUS FOR PERFORMING LOW-DENSITY PARITY-CHECK (LDPC)CODE OPERATIONS USING A MULTI-LEVEL PERMUTATION", filed on Feb. 26, 2004 and the corresponding PCT Application PCT/US2004/005783 which has the same title and filing date, are both hereby expressly incorporated by reference. These patent applications describe a product lifting method of LDPC codes. Such product liftings restrict the group of Z×Z permutation matrices used in liftings to groups that can be decomposed into a direct-product of sub-groups. For example, we assume $\Psi$ is a direct-product of three sub-groups, i.e., $\Psi=\Psi_1 \times \Psi_2 \times \Psi_3$. The dimension of $\Psi$ is equal to the product of the dimensions of $\Psi_i$, where $\Psi_i$ is the group of $K_i \times K_i$ permutation matrices. Thus, a large lifting may be implemented as multiple smaller sequential liftings. It is assumed that the dimension of group $\Psi_i$ equals to the dimension of a matrix inside the group, thus $Z=K_1 \times K_2 \times K_3$ where $K_1, K_2, K_3$ are dimensions of $\Psi_1, \Psi_2, \Psi_3$ respectively.

In accordance with the present invention we restrict the lifting group $\Psi$ to be a product-lifting group. A noted above, a product lifting can equivalently be viewed as a multi-dimensional lifting. Accordingly, the present encoder 300 of the present invention uses liftings which can be implemented as multi-dimensional liftings. Assume the projected code is of size P, i.e., with P variable nodes. One could choose a cyclic group of size 64 for the lifting. An alternative, in accordance with the invention would be a product of the cyclic group of size 16 and the cyclic group of size 4 (note 16×4=64). This group can be represented as follows. Consider indexing L=0, . . . 63 using pairs (a,b), a=0, . . . , 15 and b=0, . . . , 3 by the invertible map L=4a+b. An element of this product group is a pair (c,d) c=0, . . . , 15 and d=0, . . . , 3. The action of (c,d) on (a,b) is to permute the pair (a,b) to (a+c mod 16, d+b mod 4). This group also has order 64. The resulting lifted graph, however, can be interpreted as a lifting of a size 4P code by 16 or a size 16P code by 4 or a size P code by 64.

Various advantages offered by product liftings are realized in the context of the encoder and hardware implementations of the present invention. The value added by using product liftings in an encoder is one of the many features of the invention. Liftings by groups which are not products, e.g., by a cyclic group, allow for liftings of arbitrary size but do not offer the flexibility of product liftings.

U.S. patent application Ser. No. 10/788,115 title "METHOD AND APPARATUS FOR PERFORMING LOW-DENSITY PARITY-CHECK (LDPC)CODE OPERATIONS USING A MULTI-LEVEL PERMUTATION" describes product lifting graphs and the potential benefits of using those graphs.

The present invention expands on some of the basic concepts described in that application by describing a novel encoder 300 which uses a lifting factor Z=K×N. Various features of the invention are directed to a method and apparatus for encoding a graph with an implementation parallelism N in a flexible but relatively hardware efficient manner. K can be used as a lifting control factor and, when N is fixed, can be indicative of the size of the codeword to be generated.

We assume we have a lifted LDPC graph with lifting factor Z=K×N. The lifting group $\Psi$ to be a product-lifting group $\Psi=\Psi_1 \times \Psi_2$, where K is the dimension of group $\Psi_1$, and N is the dimension of group $\Psi_2$. We can generate the microcode for the lifted graph with lifting factor Z, which is a sequence of commands each of which carries an operator op, a rotation number r, and a memory location a. An encoder 300 implemented using parallelism Z executes each command in the following way: if op indicates a read, the controller reads a Z-bit vector from the memory at location a, reorders it the amount r, and accumulates the reordered value into a Z-bit register; if op indicates a write, the controller writes the value of the Z-bit register into the memory at location a. And the encoding is accomplished by executing the whole sequence of commands.

The microcode which is executed may be stored in the encoder description information module 372 which, in addition to storing the microcode to be used is responsible for accessing and executing the instructions included in the microcode.

The same result of executing a microcode instruction, e.g., command of the present invention, can be obtained using parallelism N, i.e. N parallel processing units, instead of parallelism $Z=K\times N$. However, in our N implementation we execute the same basic command K times, each time finishing 1/K of the job of processing the Z bits.

To better understand the encoding process of the present invention let us first consider a command that reads out a Z-bit vector from location a and reorders by amount r and then accumulates the reordered value to the Z-bit register. We write the original data vector $d=(d_1, d_2, \ldots d_K)$, each $d_j$ is an N-bit vector, where j is an integer value used as indexes. Given the lifting group is a product lifting $\Psi=\Psi_1 \times \Psi_2$, where $\Psi_1$ has dimension K and $\Psi_2$ has dimension N, let us write the reordering amount $r=(r_1,r_2)$, where $r_1$ is the reordering amount, e.g., amount of cyclic rotation, in group $\Psi_1$, and $r_2$ is the reordering amount, e.g., amount of cyclic rotation, in group $\Psi_2$. We use the notation $\Psi_1(d,r)$ to represent a reordering by amount r on vector d (of K element) in group $\Psi_1$ and the notation $\Psi_2(d,r)$ to represent a reordering by amount r on vector d (of N elements) in group $\Psi_2$. The reordering can be also thought of as a location permutation, so that the element $d_j$ at original location j goes to a new location denoted as $\Psi_{1,r}(j)$ in the reordered data. Then the reordering can be thought as a 2-stage reordering procedure. The first stage reorders in group $\Psi_2$ for N (1-bit) elements to generate vector $d'=(\Psi_2(d_1,r_2), \Psi_2(d_2,r_2), \ldots, \Psi_2(d_K,r_2))$. Then the second stage reorders in group $\Psi_1$ for K (N-bit) elements to generate vector $d''=\Psi_1(d',r_1)$. Then the reordered data d" is accumulated to a Z-bit register. As will be discussed below, in the FIG. 3 implementation, the Z bit register is implemented as a set of K N-bit registers 332, 334, 336.

We now describe how to decompose the above mentioned a single step reading-ordering-accumulation using parallelism Z into K steps of reading-ordering-accumulation using parallelism N to implement an LDPC encoder such as the LDPC encoder 300. It is a sequence of such K steps that is used by encoder 300. Assume we have K registers 332, 334, 336 and assume the Z-bit vector d at location a is physically arranged as K N-bit vectors $(d_1, d_2, \ldots d_K)$, where N-bit vector $d_j$ is stored at location a in the block j. If in step j, we read out data $d_j$, where the address is determined by both a and j, and reorder the read-out data by the amount of $r_2$ in group $\Psi_2$, e.g., using the N element controllable permuter 304, we generate $\Psi_2(d_1,r_2)$. Then we accumulate the reordered data into the $\Psi_{1,r_1}(j)$th register of those K registers 332, 334, 336. That completes the jth step. Running through $j=1, \ldots, K$, we obtain the same result as executing the command with a Z-bit vector operation but achieve this result with the lower encoder parallelism N, where N<Z.

A command that writes Z-bit register to location a and resets the Z-bit register can also be decomposed into K steps in accordance with the present invention, indeed in a much simpler way. In step j, we write the jth register of the K N-bit registers 332, 334, 336 to a location determined by j and location a, and reset that register 332, 334 or 336. Running through $j=1, \ldots, K$, we obtain the same result as executing the command with Z-bit vector operations.

The above discussion describes in principle how we can use parallelism N to implement a microcode corresponding to a lifting factor Z, e.g., a microcode which is stored in encoder description information module 372.

With reference to FIG. 3, we will now describe in greater detail the exemplary encoder 300 used to realize the K-step encoding process which allows for a parallelism of N when a lifting factor Z is used where Z>N.

In FIG. 300, a control module 312 controls the number of steps executing a command through an inner loop counter 370. Counter 370 increments by 1 at each step and resets upon reaching a maximum count determined by the code lifting factor control signal 348. Each time inner loop counter 370 reaches maximum, it triggers the outer loop counter 374 to be incremented by 1. The outer loop counter 374 determines the current executed encoding command by accessing stored encoder description information module 372. Stored encoder description information module 372 outputs the command, in the form of various signals generated according to the command, to be applied at the location determined by the outer loop counter 374. A command carries an operator op, a reordering number r, and a memory location a. Operation op specifies the read/write signal 350 to a memory module 302, the memory location a determines the memory address control signal 352 coupled to the memory module 302, and reordering number r is separated into two parts $(r_1,r_2)$ that each specifies the reordering element in the group $\Psi_1$ and $\Psi_2$ respectively. Signal $r_1$ 354 is supplied to code lifting based block selection module 310 for used in generating a block address select signal 358 used to control which block of memory in memory module 302 is accessed while signal $r_2$ 373 is supplied to the permuter 304 to control the permuting of the N elements of a block read from memory 302.

To receive the signal r1 354, code lifting based block selection module 310 has a first selection module control signal 354 coupled to part $r_1$ of the reordering number r in the command from the said control module 312. Driven by the second selection control signal 356 generated by inner loop counter 370 of the control module 312, and controlled by the control signal $r_1$ 354, the code lifting based block selection module 310 outputs block address selection signal 358 which assumes values from 1 to K, and block selection control signal 360 which assumes values $\Psi_{1,r_1}(1)$, $\Psi_{1,r_1}(2), \ldots, \Psi_{1,r_1}(K)$.

The memory module 302 has an input for receiving the read/write signal 350 coupled to the operator op output of the stored encoder description information and another input for receiving the memory address control signal 352 which corresponds to the memory location a carried by the microcode instruction stored in module 372 that is being executed at a particular point in time.

The memory module 302 includes memory 314 arranged into $K\times(N\times L)$ 1-bit storage locations 318, 320, 322 and $K\times(N\times 1)$ 1-bit storage locations 319, 321, 323. For convenience, we identify the storage locations with K blocks of $(N\times L)$ 1-bit locations as block 1, ..., K used for codeword storage, and we identify the storage locations with K blocks of $(N\times 1)$ 1-bit locations as block 1, ..., K used for temporary storage of values. The memory 314 is accessed at a location that is a function of the memory address control signal a 352 and block address select signal k 358. Memory address logic module 316 implements such a function. Given (a, k), the memory module 302 either reads or writes the N-bit vector on location a in the kth block depending on whether the read/write signal 350 indicates that a read or a write operation should be performed.

A read-out of memory module 302 outputs an N-bit vector 340 read from memory 314. This N bit vector is fed into the N element controllable permuter module 304. Module 304 implements the reordering in group $\Psi_2$; its reordering control signal is coupled to the $r_2$ signal output of the stored encoder description information module 372. The reordering number r, from which the $r_2$ signal is derived, used at a particular point in time is obtained from the microcode command from the information module 372 which is being executed at the particular point in time.

A reordered N-bit vector output of the permuter module 304 is coupled to the first N-bit vector input 342 of an N element vector accumulator module 306. The second N-bit vector input 346 of the accumulator module 306 is fed from the controllable storage device module 308 which includes K N bit registers 332, 334, 336. The vector accumulator module 306 generates an N-bit vector output as the XOR sum of the two N-bit vector inputs. In various embodiments, the vector accumulator module 306 is implemented using N XOR circuits arranged in parallel with each XOR circuit being coupled to a different summer for summing the result of the XOR operation to the most recently generated XOR result produced by the particular one of the N XOR circuits. The N bit wide output of the Accumulator module is coupled to the input 344 of the controllable storage device module 308.

The controllable storage device module 308 includes K registers, each register storing N-bits. A block select control signal 360, coupled to the code lifting based block selection module 310, determines which one of the K registers is to be accessed at a particular point in time. A read/write control signal 350, coupled to the operator op carried in the command from the control module 312, determines the accessing mode, e.g., a read or a write accessing mode. Assume the block selection control signal 360 says j. If the control signal is a read, then the N-bit output vector from the controllable storage device 308 takes the value of the jth register, and the accumulated value from the N element vector accumulator module 306 is written into the jth register. In other words, the reordered value from the N element controllable permuter 304 is accumulated into the jth register indicated by the block select control signal 360. If the read/write control signal 350 is a write, the output vector again assumes the value of the jth register, and we then reset the jth register to zero.

In summary, given the microcode for a lifted graph with lifting factor $Z=K\times N$, various embodiments of the present invention are directed to an encoder that performs N-bit vector operations. Each N bit vector operation involves the execution of a command in a microcode that is descriptive of the code structure to be used for encoding. To implement encoding of a codeword including Z bits each N bit command is implemented in K steps in a sequence controlled by part of the stored microcode command information and one or more counters.

In various embodiments of the present invention, the proposed encoder can generate different codes that share the same rate as the projected graph, but have different codeword lengths. That is accomplished by using SK, a selected lifting factor control value which is a divisor of K instead of K itself, as the number of steps executed for each command. More specifically, the group $\Psi_1$ in the product lifting may be still a direct-product of two groups $\Psi_1=\Psi_{11}\times\Psi_{12}$ and SK is the dimension of matrix $\Psi_{12}$, and J is the dimension of $\Psi_{11}$, thus $K=J\times SK$. As a special case, $\Psi_{11}$ might be a group of single element 1 and $\Psi_{12}$ is $\Psi_1$, so SK=K and J=1. In any event, in the lifted graph, if we ignore the $\Psi_{11}$ component inside the lifting group, then we have a lifted graph with a lifting factor $Z/J=SK\times N$. A different way to see this is we take the original graph and project it onto the lifting group $\Psi_{11}$, thus in the parity check matrix, every nonzero entry that indicates a $Z\times Z$ permutation matrix is now projected to a $Z/J\times Z/J$ permutation matrix. As such, the same sequence of encoding process as matrix multiplication in the larger graph still holds for the projected graph, even for the matrix inversion $\phi^{-1}$ by the first principal of group theory.

Thus, the microcode describing the larger graph with lifting factor Z is also a microcode describing the projected graph with lifting factor $Z/J=SK\times N$. By the same line of reasoning as presented above in regard to the case for Z, we can use the same encoder with N-bit vector operation to encode a code with lifting factor $SK\times N$ by executing each command within the microcode in SK steps in a sequence controlled by part of the command information stored in stored encoder description information module 372.

Other codes of different block lengths sharing the same microcode exist if $\Psi_1$ can still be written as a direct-product of two other groups $\Psi_1=\Psi_{11}'\times\Psi_{12}'$ which is the case in various implementations of the present invention. The same encoder, in accordance with the present invention, with parallelism N can encode such a code with a lifting factor $Z/J'$, where J' is the dimension of $\Psi_{11}'$ by specifying corresponding SK. Further additional structure in $\Psi_1$ may lead to more codes of different block lengths encodable on the same encoder hardware. Therefore, by controlling SK according to the group structure, the encoder can generate a class of LDPC codes with different block lengths.

In FIG. 300, the selected code lifting factor, which can serve as a codeword length selection signal since it will control the length of generated codewords, can be specified through the code lifting factor control signal 348. The signal 348 is supplied to the inner loop counter 370 and determines the maximum count of the inner loop counter 370.

The flexibility of the encoder of the present invention and the ease with which it can be implemented through the use of control code will be apparent in view of the following control code example. The following code may serve as code description information which is stored in stored in the stored encoder description information module 372 and executed, e.g., a line at a time, to implement an encoding operation.

Table 1, which follows, comprises the combination of Tables 1A and 1B lists the instructions of an exemplary control code, e.g., microcode, corresponding to a code structure having a maximum lifting factor $Z=64$. In the example, the code was designed for the case where N=16, K=4 and L=10. $Z=K\times N$ and thus $Z=64=4\times16$. The maximum supported codeword length will be $K\times N\times L$ which is 640 in this example. The projected graph described by the code has 4 check nodes and 10 variable nodes. When lifted by the maximum lifting factor Z this will result in a code structure having 256 (64×4) check nodes and 640 (64×10) variable nodes. The hardware is designed for operating at a level of parallelism N where N=16. The lifting factor control signal SK, used to specify the codeword length, in this embodiment can be any divisor of K, where K as noted above is 4(K=Z/N=64/16), i.e., the maximum supported lifting factor control value. Thus, by selecting different lifting factor control signals to control the number of repetitions of the microcode of Table 1, it is possible to encode codewords corresponding to 3 different lengths, e.g. when SK=1 the codeword length will equal (1×16×10) 160 bits, when SK=2 the codeword length will equal (2×16×10) 320 bits, and when SK=K=4 the codeword length will equal (4×16×10)=640 bits. In the microcode, shown in Table 1, in the op column 1 is used to indicate a read while a 0 is used to indicate a write instruction. The control values r1 and r2 are stored in the value r. r1 is determined from the value r as the integer divisor of r when divided by N. That is, r1=r div N. r2 is determined from the value r by taking the modulus of r/N. In this example N=16. Consider for example the first instruction 1 43 4. This instruction would be interpreted as a read (op=1) instruction, r1=(r div N)=(43 div 16)=2, while r2=(r mod N)=(43 mod 16)=11. The control value a is provided directly from the table and is, in the case of the first instruction=4. When the control value a is within the range 0 . . . L−1., e.g. 0..9 for the exemplary microcode, memory accessed is used for codeword storage, e.g. one of the K blocks 318, 320, 322 is accessed. When the control value a is outside the range 0 . . . L−1, e.g., 10 for the exemplary microcode, memory accessed is used for temporary storage of values, e.g., one of the K blocks 319, 321, 323 is accessed.

TABLE 1

(Start)

| op | r | a |
|---|---|---|
| 1 | 43 | 4 |
| 1 | 5 | 5 |
| 1 | 6 | 7 |
| 1 | 44 | 8 |
| 1 | 36 | 3 |
| 0 | 0 | 2 |
| 1 | 10 | 4 |
| 1 | 30 | 5 |
| 1 | 47 | 6 |
| 1 | 9 | 7 |
| 1 | 17 | 3 |
| 0 | 0 | 1 |
| 1 | 25 | 5 |
| 1 | 32 | 6 |
| 1 | 58 | 8 |
| 1 | 45 | 9 |
| 1 | 16 | 2 |
| 0 | 0 | 0 |
| 1 | 42 | 4 |
| 1 | 17 | 8 |
| 1 | 62 | 9 |
| 1 | 6 | 0 |
| 1 | 38 | 1 |
| 0 | 0 | 10 |
| 1 | 17 | 10 |
| 1 | 19 | 10 |
| 1 | 21 | 10 |
| 1 | 29 | 10 |
| 1 | 31 | 10 |
| 1 | 49 | 10 |
| 1 | 50 | 10 |
| 1 | 51 | 10 |
| 1 | 52 | 10 |
| 1 | 53 | 10 |
| 1 | 54 | 10 |
| 1 | 55 | 10 |
| 1 | 56 | 10 |
| 1 | 58 | 10 |
| 1 | 63 | 10 |
| 0 | 0 | 3 |
| 1 | 43 | 4 |
| 1 | 5 | 5 |
| 1 | 6 | 7 |
| 1 | 44 | 8 |
| 1 | 36 | 3 |
| 0 | 0 | 2 |
| 1 | 10 | 4 |
| 1 | 30 | 5 |
| 1 | 47 | 6 |
| 1 | 9 | 7 |
| 1 | 17 | 3 |
| 0 | 0 | 1 |
| 1 | 25 | 5 |
| 1 | 32 | 6 |
| 1 | 58 | 8 |
| 1 | 45 | 9 |
| 1 | 16 | 2 |
| 0 | 0 | 0 |

The methods and apparatus of the present invention can be used to implemented a wide variety of devices including, for example, wireless terminals, base stations, data storage devices and other types of devices where encoding and/or decoding of data to prevent and/or correct errors might be useful.

Figure 4:
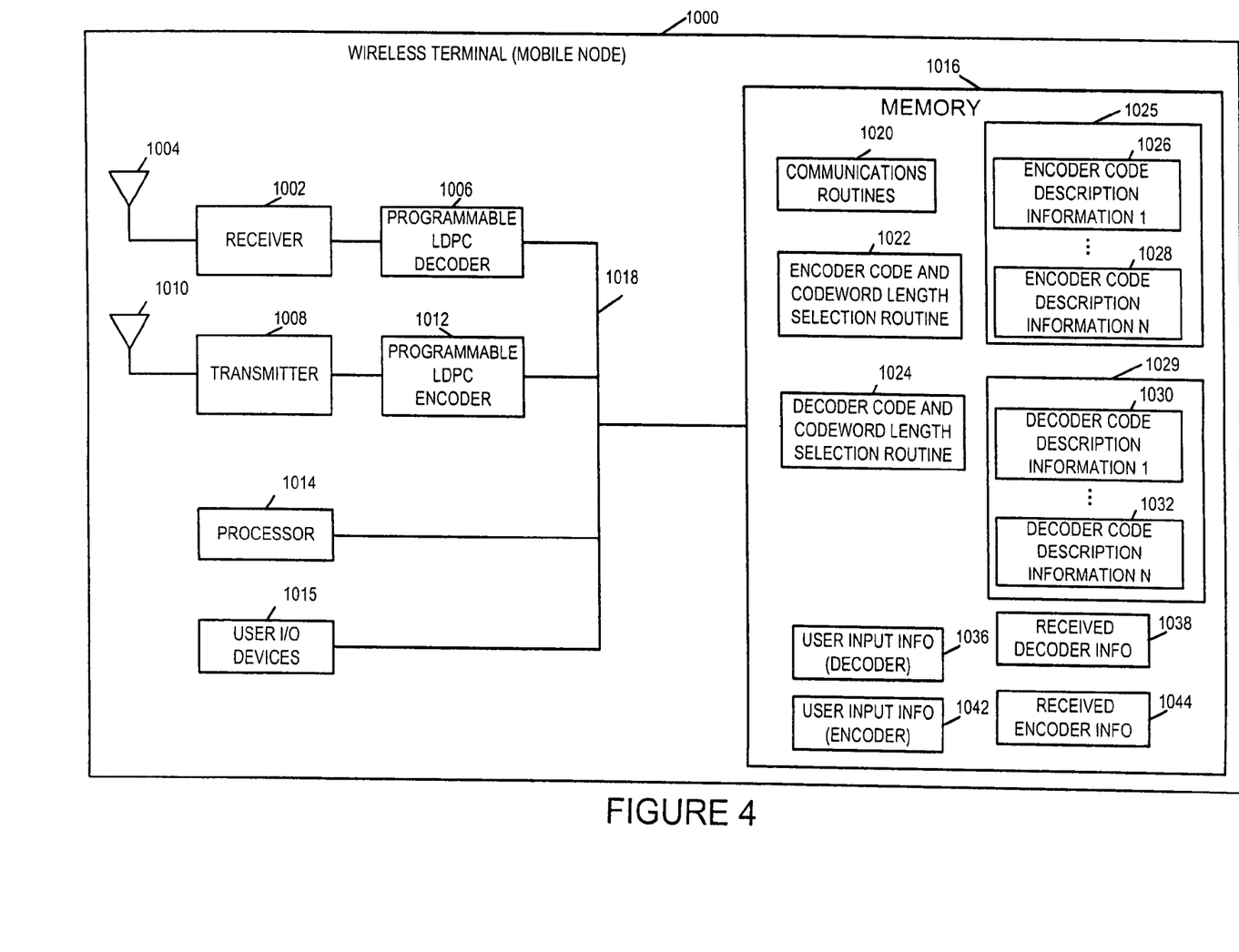
FIG. 4 illustrates a device, e.g., mobile node, which uses an exemplary programmable LDPC encoder implemented in accordance with the present invention.

FIG. 4 is a drawing of an exemplary wireless terminal (WT) 1000, e.g., mobile node, implemented in accordance with LDPC encoder/decoder apparatus that use methods of the present invention. Exemplary WT 1000 includes a receiver 1002, a receiver antenna 1004, a programmable LDPC decoder 1006, a transmitter 1008, a transmitter antenna 1010, a programmable LDPC encoder 1012, a processor 1014, user I/O devices 1015 and a memory 1016. The programmable LDPC decoder 1006, programmable LDPC encoder 1012 (which can be implemented using the encoder 300 of FIG. 3), processor 1014, user I/O devices 1015 and memory 1016 are coupled together via a bus 1018 over which the various elements may interchange data and information.

The receiver 1002 is coupled to the receiver antenna 1004 through which the WT 1000 may receive signals from other devices, e.g., encoded downlink signals from a base station. The receiver 1002 is also coupled to the programmable LDPC decoder 1006 which may decode received downlink signals in accordance with the invention. Received signals may include, e.g., in addition to LDPC coded data, signals, e.g., control information, used to indicate LDPC code structure used to encode data which is being received and/or the codeword length of codewords included in received data. The received data may include codewords corresponding to different applications. In accordance with the invention, the decoder may switch from decoding data corresponding to a first code structure and codeword length to decoding data corresponding to a second code structure and a second codeword length. The first and second codeword structures may be different with the decoder being loaded with the appropriate code structure information, e.g., control code in the form of microcode, in response to information included in the received information. The control information is normally not encoded using LDPC codes to facilitate rapid detection and interpretation of the control information. The first and second codeword lengths can also be different. In some cases, the first and second code structures are the same but the codeword lengths of data corresponding to different applications may be different. In such case the code structure information need not be updated to decode the codewords of different sizes and merely the codeword length information, e.g., lifting factor information need be supplied to the decoder as the codeword length of the received data changes. The codeword length information maybe specified as a code lifting factor for the code structure being used. As will be discussed below, code structure information, e.g., control code, can be used to control the programmable LDPC decoder while codeword length information can be used to set the codeword length for decoding purposes. Such information can be conveyed to the decoder 1006 from memory 1016 via bus 1018.

The transmitter 1008 is coupled to the transmitter antenna 1010 through which the WT 1000 may transmit uplink signals including encoded uplink signals to base stations. The transmitter 1008 is coupled to the programmable LDPC encoder 1012 which encodes various uplink signals, e.g., data signals corresponding to different applications, prior to transmission. The encoder can be loaded with different sets of code description information, e.g., different sets of control codes such as microcode, corresponding to different code structures. In addition the encoder 1012 can be supplied with codeword length information, e.g., in the form of code lifting factor information, used to control the length of codewords generated by the encoder 1012. Information selecting the codeword structure and/or codeword length may be obtained from received information, e.g., the encoder may encode data generated by an application using the same codeword structure and codeword length as was used to decode received data intended for the particular application generating data. Thus, the encoder may be programmed to match the encoding structure and codeword length being used by another device with which the wireless terminal is interacting. Alternatively, a user of the device may specify use of a particular codeword structure and/or codeword length or such information may be specified by a communications routine or other program stored in the wireless terminal.

Code structure information and/or codeword length information can be conveyed from memory 1016 to the programmable LDPC encoder 1012 over bus 1018. User I/O devices 1015, e.g., keypads, speakers, microphones, displays, etc. provide interfaces for the user to input data and information, e.g., data and information to be encoded and communicated to another WT and for the user to output and/or display received data/information, e.g., received data and information from a peer node which has been decoded. User I/O devices 1015 provide an interface allowing a user to select and/or specify the code associated with a set of data, code length indicator, and/or sets of code description information to be used by the programmable LDPC decoder 1006 and/or programmable LDPC encoder 1012.

The processor 1014, e.g., a CPU, executes the routines and uses the data/information in memory 1016 to control the operation of the wireless terminal 1000 and implement the methods of the present invention.

Memory 1016 includes a group 1025 of encoder code description information sets 1026, 1028 and a group 1029 of decoder code description information sets 1030, 1032. Each encoder code description information set 1026, 1028 includes control codes, e.g., microcode, which reflects the code structure of the code to be used for encoding data. Each set of information 1026, 1028 corresponds to a different code structure. The encoder code description information can be loaded into the encoder control module of the programmable LDPC encoder 1012 and used, e.g., as stored encoder description information, to control encoding of data. Similarly, each of the decoder code description information sets 1030, 1032 includes control codes, e.g., microcode, which reflects the code structure of the code to be used for decoding data. Each set of decoder code description information 1030, 1032 corresponds to a different code structure. The decoder code description information can be loaded into the control module of the programmable LDPC decoder 1006 and used, e.g., as stored decoder description information, to control decoding of data.

Memory 1016 includes communications routines 1020, encoder code and codeword length selection routine 1022, and decoder code and codeword length selection routine 1024. Communications routines 1020 may control general communications and interactions with other wireless devices. The communications routine being implemented for given application may specify the code structure and/or codeword length to be used for a particular communications application when encoding and/or decoding data using LDPC codes. Encoder code and codeword selection routine 1022 is responsible for selecting the code structure and thus corresponding encoder code description information 1026, 1028 to be used for a particular application. This selection may be made based on information received from a communications routine 1020, information received via receiver 1002 or from user input. The encoder code and codeword length selection routine 1022 is responsible for loading the programmable LDPC encoder 1012 with the selected code description information and for supplying information, e.g., a selected code lifting factor, to the programmable encoder 1012 if it has not already been configured to perform encoding in accordance with the selected code and codeword length. The decoder code and codeword length selection routine 1024 is responsible for loading the programmable LDPC decoder 1006 with the selected code description information and for supplying information, e.g., a selected code lifting factor, to the programmable decoder 1006 if it has not already been configured to perform decoding in accordance with the selected code and codeword length.

In addition to the above discussed routines and information relating to encoding and decoding, the memory 1016 may be used to store received decoder information 1038, e.g., received information used by the decoder code and codeword length selection routine 1024 which indicates a code structure and codeword length to be used for decoding. In addition received encoder information 1044, e.g., received information used by the encoder code and codeword length selection routine 1022 which indicates a code structure and codeword length to be used for encoding may be stored in memory 1016. User input information 1036 relating to decoding and user input information relating to encoding 1042 can also be stored in memory 1016. Such information may be the same as or similar to decoder information 1038 and encoder information 1044 but is obtained from a user via a user I/O device 1015 rather than via receiver 1002.

For a detailed discussion of an exemplary programmable LDPC decoder which can, and in some embodiments is used, as the programmable LDPC decoder 1006, see U.S. patent application Ser. No. 10/895,645, titled "LDPC DECODING METHODS AND APPARATUS", filed on the same day as the present application, which names as inventors Tom Richardson, Hui Jin and Vladimir Novichkov, and which is hereby expressly incorporated by reference. Also expressly incorporated by reference for purposes of providing background information is U.S. Pat. No. 6,633,856.

Using the above discussed routines and stored encoder/decoder information, the wireless terminal can, and does, switch between using different code structures and codeword lengths for both encoding and decoding purposes as a function of received information, e.g., user information or information received via receiver 1002. Encoder/decoder changes may also be triggered by the particular communications routine 1020 executed at a particular point in time. Accordingly, the present invention allows for a great deal of flexibility in encoding and decoding of LDPC codes with a single set of hardware which can be easily modified through the use of code updates corresponding to different code structures and/or changes in a codeword length control parameter.

Various concepts relating to LDPC code structures upon which the present invention builds are described and discussed in U.S. patent application Ser. No. 10/618,325 titled "METHODS AND APPARATUS FOR ENCODING LDPC CODES", filed Jul. 11, 2003, and which is hereby expressly incorporated by reference. A better appreciation for the techniques and benefits of the methods and apparatus of the present invention can be obtained when viewed in the light of the discussion found in the incorporated patent application.

Figure 5:
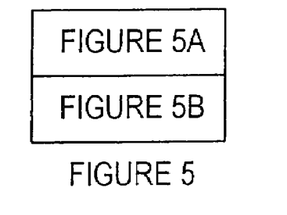
FIG. 5, comprising the combination of FIG. 5A and FIG. 5B, is a flowchart of an exemplary method of operating an exemplary communications device implemented in accordance with the present invention to perform encoding and decoding in accordance with the present invention.
Figure 5A:
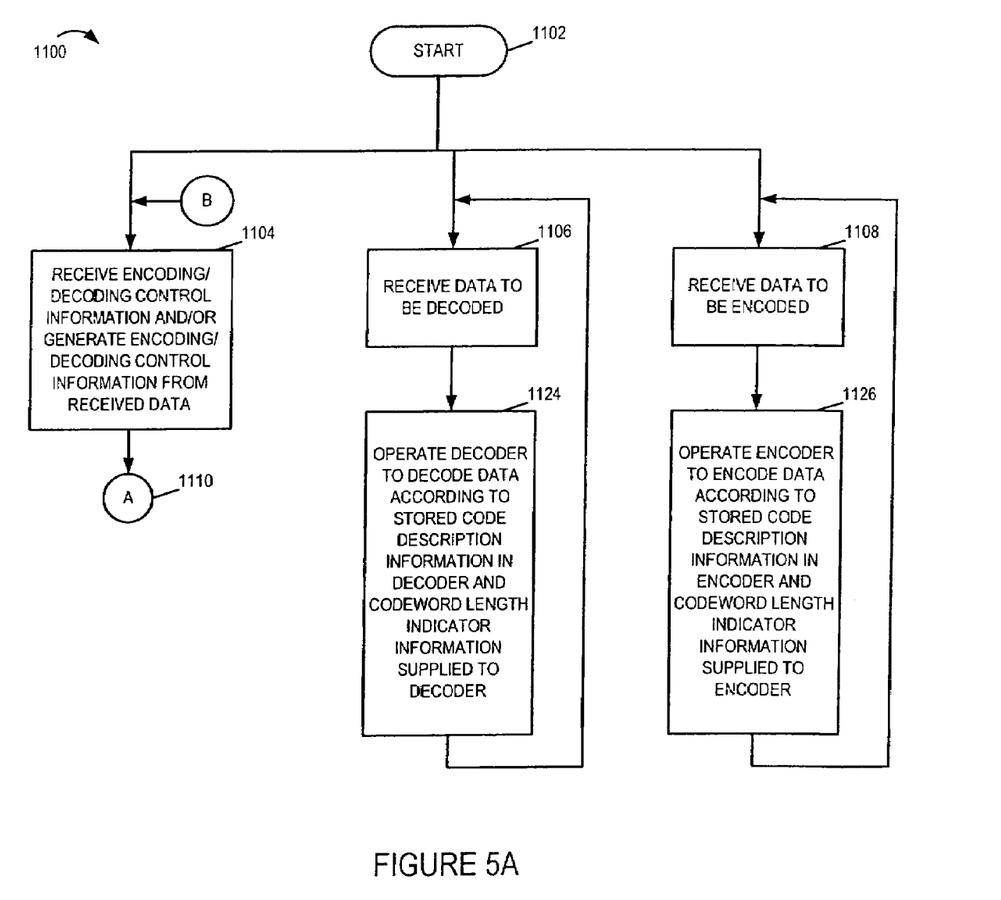
Figure 5B:
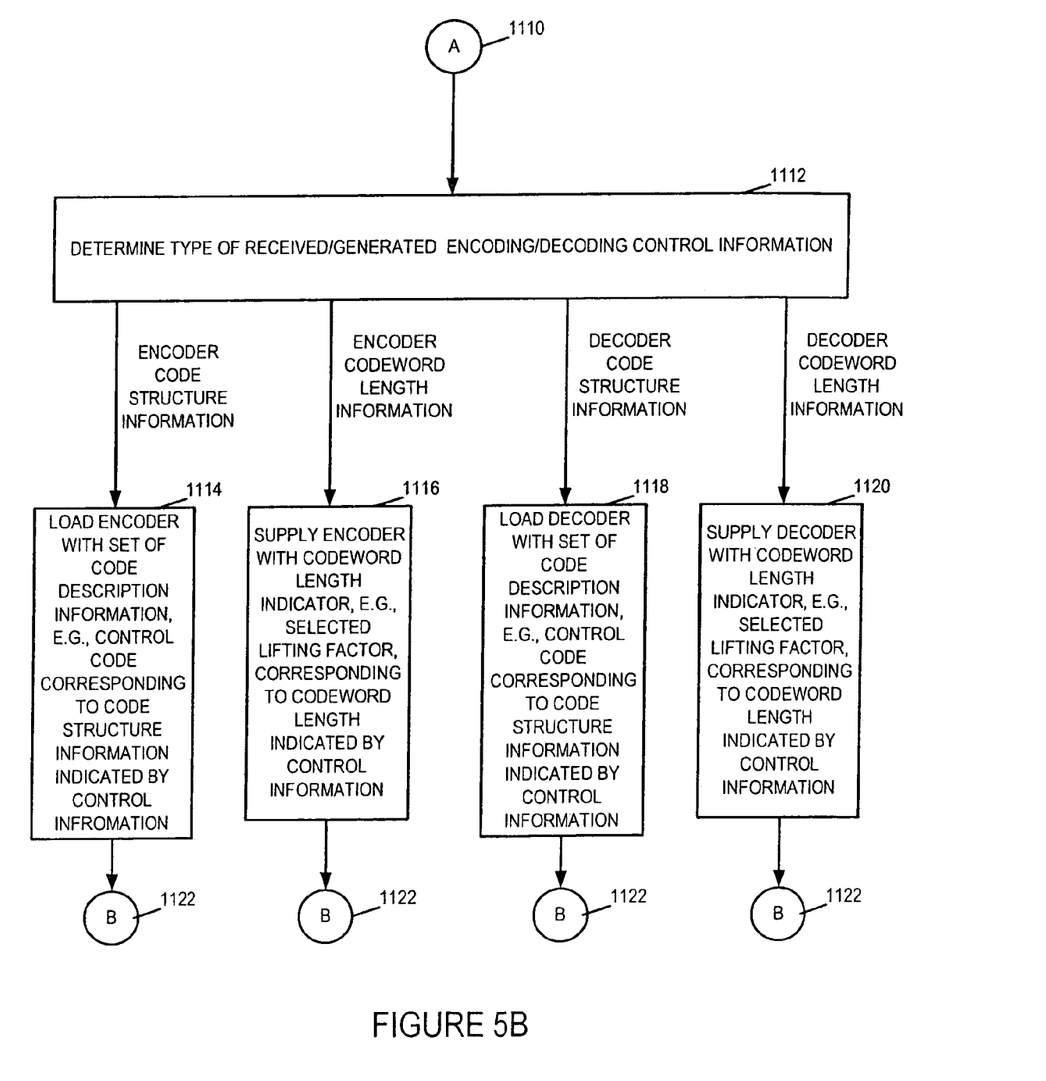

FIG. 5, comprising the combination of FIG. 5A and FIG. 5B, is a flowchart 1100 of an exemplary method of operating an exemplary communications device implemented in accordance with the present invention, e.g., WT 1000, to perform encoding and decoding in accordance with the present invention. Operation starts in step 1102, in which the WT 1000 is powered on and initialized. Operation proceeds from step 1102 to steps 1104, 1106, and steps 1108.

In step 1104, the WT 1000 is operated to receive encoding/decoding information and/or generate control information from received data. The encoding/decoding information, e.g., control information for the programmable LDPC encoder 1012 and/or programmable LDPC decoder, may be received via a received signal processed through receiver 1002 and/or as user input received via user I/O devices 1015. In addition, received encoded data may be processed to generate control information. For example, multiple attempts at decoding can be performed using different code structure information and/or different codeword lengths. Upon successful decoding control information is generated in some embodiments indicating the code structure and/or codeword length which is to be used to decode incoming data and, in some embodiments encode outgoing data as well. Operation proceeds from step 1104 via connecting node A 1110 to step 1112. In step 1112, the WT 1000 is operated to determine the type of received encoding/decoding control information. Based upon the determination of step 1112, operation proceeds to step 1114, 1116, 1118, or 1120.

If it is determined in step 1112, that the type of control information is encoder code structure information, then operation proceeds to step 1114. In step 1114, the WT 1000 is operated to load the encoder 1012 with a set of code description information, e.g., control code corresponding to the code structure information indicated by the control information. Operation proceeds from step 1114 to connecting node B 1122.

If it is determined in step 1112, that the type of information is encoder codeword length information, then operation proceeds to step 1116. In step 1116, the WT 1000 is operated to supply the encoder 1012 with codeword length indicator, e.g., selected lifting factor, corresponding to the codeword length indicated by the control information. Operation proceeds from step 1116 to connecting node B 1122.

If it is determined in step 1112, that the type of control information is decoder code structure information, then operation proceeds to step 1118. In step 1118, the WT 1000 is operated to load the decoder 1006 with a set of code description information, e.g., control code corresponding to the code structure indicated by the control information. Operation proceeds from step 1118 to connecting node B 1122.

If it is determined in step 1112, that the type of information is decoder codeword length information, then operation proceeds to step 1120. In step 1120, the WT 1000 is operated to supply the decoder 1006 with codeword length indicator, e.g., selected lifting factor, corresponding to indicate codeword length. Operation proceeds from step 1120 to connecting node B 1122.

From connecting node B 1122 operation returns to step 1104, where WT 1104 waits to receive other encoding/decoding information, e.g., information to complete the configuration of the programmable decoder 1006 and/or programmable encoder 1012, and/or information to change selected settings, e.g., codeword length settings, of the decoder 1006 and/or encoder 1012.

In step 1106, the WT 1000 including a previously configured programmable decoder 1006 is operated to receive through receiver 1002 data to be decoded, e.g., encoded user data from a peer node of WT 1000. The received data is forwarded to the decoder 1006. Operation proceeds from step 1106 to step 1124. In step 1124, the decoder 1006 is operated to decode data according to stored code description information in decoder 1006 and codeword length indicator information that has been supplied to the decoder. Operation proceeds from step 1124 to step 1106, where additional data to be decoded is received.

In step 1108, the WT 1000 including a previously configured programmable encoder 1012 is operated to receive through user I/O devices 1015 data to be encoded, e.g., input data from the user of WT 1000 intended to be encoded and communicated to a peer node of WT 1000. The received data is forwarded to the encoder 1012. Operation proceeds from step 1108 to step 1126. In step 1126, the encoder 1012 is operated to encode data according to stored code description information and codeword length indicator information supplied to the encoder. Operation proceeds from step 1126 to step 1108, where additional data to be encoded is received.

Over time, as the control information corresponding to the codeword length information, e.g., selected lifting factor, loaded into the encoder 1012 and decoder 1006 changes, the codeword length will change. Thus, the codeword length can, and in various implementations will, change as the wireless terminal switches from receiving data corresponding to a first device and/or application to processing data corresponding to second device and/or application. In addition, the code structure information used by the encoder 1012 and/or decoder 1006 can be changed over time as the wireless terminal interacts with a different device and/or implements a different application. Thus, at a first point in time the encoder and decoder may process codewords corresponding to a first length and/or code structure and at another time processes codewords corresponding to a second length and/or code structure. At still other points in time the programmable LDPC encoders 1012 and decoders 1006 of the present invention may use other code structures and/or codeword lengths. The various supported codeword lengths will normally be up to a maximum size determined by the amount of memory available and/or number and size of available registers in the encoder 1012 and decoder 1006.

The following patent applications and patent provide information on encoding and/or decoding LDPC codes and are hereby expressly incorporated by reference. U.S. patent application Ser. No. 10/788,115 filed Feb. 26, 2004; U.S. patent application Ser. No. 10/117,264 filed Apr. 4, 2002; U.S. patent application Ser. No. 10/618,325 and U.S. Pat. No. 6,633,856.

Numerous variations on the method and apparatus of the present invention are possible. Thus, the modules used to implement the present invention may be implemented as software, hardware, or as a combination of software and hardware. For example, various features of the present invention may be implemented in hardware and/or software. For example, some aspects of the invention may be implemented as processor executed program instructions. Alternatively, or in addition, some aspects of the present invention may be implemented as integrated circuits, such as ASICs for example. The apparatus of the present invention are directed to software, hardware and/or a combination of software and hardware. Machine readable medium including instructions used to control a machine to implement one or more method steps in accordance with the invention are contemplated and to be considered within the scope of some embodiments of the invention.

The present invention is directed to, among other things, software which can be used to control a processor to perform encoding and/or decoding in accordance with the present invention. The methods and apparatus of the present invention may be used with OFDM communications systems as well as with other types of communications systems including CDMA systems.

What is claimed is:

1. A method of encoding information using a LDPC encoder, the method comprising:

receiving a first codeword length information indicative of the length of codewords to be generated, said first codeword length being one of a plurality of supported codeword lengths, each of the plurality of supported codeword lengths being divisible by a value N×K, wherein N and K are both integers greater than one;

supplying said codeword length information to a control input of said LDPC encoder;

operating the LDPC encoder to receive data to be encoded; and operating the LDPC encoder to generate codewords from received data based on the indicated length of codewords to be generated, where operating the LDPC encoder to generate codewords includes repeating a set of instructions K times to produce a codeword of N×K×L bits, where L is a positive integer, and wherein said set of instructions is repeated a different number of times for different codeword lengths.

2. The method of claim 1, further comprising:

receiving a second codeword length information indicative of the length of additional codewords to be generated, said length of additional codewords being a second number of bits which is different form a first number of bits corresponding to said first codeword length information.

3. The method of claim 2, wherein said first codeword length information is a first selected code lifting factor signal.

4. The method of claim 1, further comprising:

storing a first set of code structure description information in a module in said LDPC encoder; and using the stored first set of code description information to perform an LDPC encoding operation.

5. The method of claim 4, further comprising:

storing a second set of code structure description information in said module in said LDPC encoder, the second set of code structure description information corresponding to a LDPC code having a different structure than a code structure to which the first set of code structure description information corresponds.

6. The method of claim 5, further comprising:

encoding data using the first set of code structure description information when communicating with a first device; and encoding data using the second set of code structure description information when communicating with a second device.

7. The method of claim 6, wherein the first set of code structure description information is used at a different point in time from when the second set of code structure information is used.

8. The method of claim 4, wherein said step of storing a first set of code structure description information is in response to receiving a signal indicating that codewords corresponding to said first set of code structure description information are to be used.

9. The method of claim 4, wherein said step of storing a first set of code structure description information is in response to receiving a signal including codewords encoded according to a code structure corresponding to said first set of code structure description information.

10. The method of claim 4, wherein said first set of code structure description information includes encoder control instructions.

11. The method of claim 10, wherein each encoder control instruction includes one of a read and a write operation indicator.

12. The method of claim 11, where each encoder control instruction further includes rotation control information.

13. The method of claim 11, where each encoder control instruction further includes memory address information.

14. An LDPC encoder comprising;

a memory module for storing a set of encoding instructions;

a control input for receiving a first codeword length information value indicative of the length of codewords to be generated, said first codeword length being one of a plurality of supported codeword lengths, each of the plurality of supported codeword lengths being divisible by a value N×K, wherein N and K are both integers greater than one;

a data input for receiving data to be encoded; and an encoding module for generating codewords from received data based on the indicated length of codewords to be generated, where generating codewords includes repeating said set of instructions K times to produce a codeword of N×K×L bits, where L is a positive integer, and wherein said set of instructions is repeated a different number of times for different codeword lengths.

15. The LDPC encoder of claim 14, wherein said first codeword length information value is a first selected code lifting factor signal.

16. The LDPC encoder of claim 14, further comprising:

a first set of code structure description information stored in said memory.

17. The LPDC encoder of claim 16, further comprising:

a second set of code structure description information stored in said memory, the second set of code structure description information corresponding to a LDPC code having a different structure than a code structure to which the first set of code structure description information corresponds.

18. An LDPC encoder comprising:

memory means for storing a set of encoding instructions;

control input means for receiving a first codeword length information value indicative of the length of codewords to be generated, said first codeword length being one of a plurality of supported codeword lengths, each of the plurality of supported codeword lengths being divisible by a value N×K, wherein N and K are both integers greater than one;

data input means for receiving data to be encoded; and encoding means for generating codewords from received data based on the indicated length of codewords to be generated, where generating codewords includes repeating said set of instructions K times to produce a codeword of N×K×L bits, where L is a positive integer, and wherein said set of instructions is repeated a different number of times for different codeword lengths.

19. The LDPC encoder of claim 18, wherein said first codeword length information value is a first selected code lifting factor signal.

20. The LDPC encoder of claim 18, further comprising:
a first set of code structure description information stored in said memory means.

21. The LPDC encoder of claim 20, further comprising:
a second set of code structure description information stored in said memory means, the second set of code structure description information corresponding to a LDPC code having a different structure than a code structure to which the first set of code structure description information corresponds.

22. A machine readable medium embodying machine executable instructions for controlling an encoder to implement an LDPC encoding method, the method comprising:
receiving a first codeword length information indicative of the length of codewords to be generated, said codeword length being one of a plurality of supported codeword lengths, each of the plurality of supported codeword lengths being divisible by a value N×K, wherein N and K are both integers greater than one;
receiving data to be encoded; and
encoding the received data to generate codewords from the received data based on the indicated length of codewords to be generated, said encoding including repeating a set of instructions K times to produce a codeword of N×K×L bits, where L is a positive integer, and wherein said set of instructions is repeated a different number of times for different codeword lengths.

23. A device including a processor, the processor being configured to:
receive a first codeword length information indicative of the length of codewords to be generated, said codeword length being one of a plurality of supported codeword lengths, each of the plurality of supported codeword lengths being divisible by a value N×K, wherein N and K are both integers greater than one;
receive data to be encoded; and
encode the received data to generate codewords from the received data based on the indicated length of codewords to be generated, said encoding including repeating a set of instructions K times to produce a codeword of N×K×L bits, where L is a positive integer, and wherein said set of instructions is repeated a different number of times for different codeword lengths.

* * * * *